(12) United States Patent
Halpern

(10) Patent No.: US 6,509,067 B2
(45) Date of Patent: Jan. 21, 2003

(54) METHOD AND APPARATUS FOR THE DEPOSITION OF METAL NANOCLUSTERS AND FILMS ON A SUBSTRATE

(75) Inventor: Bret L. Halpern, Bethany, CT (US)

(73) Assignee: Jet Process Corporation, New Haven, CT (US)

(*) Notice: Subject to any disclaimer, the term of this patent is extended or adjusted under 35 U.S.C. 154(b) by 0 days.

(21) Appl. No.: 09/845,931

(22) Filed: Apr. 30, 2001

(65) Prior Publication Data

US 2001/0055654 A1 Dec. 27, 2001

Related U.S. Application Data

(60) Provisional application No. 60/200,208, filed on Apr. 28, 2000.

(51) Int. Cl.⁷ .................................................. B05D 3/10
(52) U.S. Cl. ..................... 427/537; 427/248.1; 427/251; 427/255.5
(58) Field of Search ............................. 427/248.1, 600, 427/250, 251, 255.5, 348, 349, 424, 533, 535, 537

(56) References Cited

U.S. PATENT DOCUMENTS

| | | | | |
|---|---|---|---|---|
| 5,356,672 A | * | 10/1994 | Schmitt, III et al. | 427/446 |
| 5,759,634 A | * | 6/1998 | Zang | 427/446 |
| 6,126,740 A | * | 10/2000 | Schulz et al. | 117/4 |
| 6,232,264 B1 | * | 5/2001 | Lukehart et al. | 502/150 |
| 6,268,014 B1 | * | 7/2001 | Eberspacher et al. | 427/191 |

* cited by examiner

Primary Examiner—Timothy Meeks
Assistant Examiner—William Phillip Fletcher, III
(74) Attorney, Agent, or Firm—McCormick, Paulding & Huber LLP

(57) ABSTRACT

A method for forming metallic nanoclusters upon a substrate includes moving the substrate through a deposition chamber at a predetermined uniform velocity and depositing metallic precursor compounds onto the substrate. The metallic precursor compounds are subsequently bombarded with an ultrasonic jet of atomic hydrogen to form the metallic nanoclusters.

11 Claims, 2 Drawing Sheets

METHOD AND APPARATUS FOR THE DEPOSITION OF METAL NANOCLUSTERS AND FILMS ON A SUBSTRATE

CROSS REFERENCE TO RELATED APPLICATION

This application claims priority to provisional application Ser. No. 60/200,208, filed Apr. 28, 2000, herein incorporated by reference in its entirety.

FIELD OF INVENTION

This invention relates, in general, to a method and apparatus for the deposition of metal nanoclusters and films on a substrate and more particularly, is directed to a deposition system incorporating a Jet Vapor Deposition (hereinafter, 'JVD') source apparatus utilizing a hydrogen atom (H atom) jet for the deposition metal nanoclusters and films.

BACKGROUND OF THE INVENTION

Deposited thin films have major, diverse technological functions and enormous commercial value. There now exist diverse methods for vapor deposition of metals, semiconductors, insulators and organics, as well as complex multicomponents such as oxides and nitrides. In general, deposition methods fall into two classes. In Chemical Vapor Deposition (hereinafter, 'CVD'), precursor molecules react at a heated substrate, usually at relatively high pressures, to generate species that comprise the deposited film. In Physical Vapor Deposition (hereinafter, 'PVD'), the film species are generated some distance from the substrate, usually in a high vacuum; the gas phase mean free path is large, and film species travel by "line of sight" to deposit on the substrate.

Deposition techniques do not always fit this traditional description. The assignee of the present invention has developed a family of vapor deposition methods referred to as Jet Vapor Deposition (JVD), in which film species are made remotely, as in PVD, but the vacuum is "low", and the mean free path is small. Film components travel "line of sight" because they are convected in a sonic, collimated, "jet in low vacuum". Exemplary processes, based on patented JVD sonic nozzle sources such as the hot filament wirefeed, and the "electron jet" or "e-jet", include deposition of metals such as Cu, Au, Ag, Sn, Pb, Ni, Ti, Ta, and many others, singly or as alloys, in simple or multilayer form. However, it is also possible in JVD to convect species to the substrate that then undergo film forming or film modifying reactions at the surface just as in CVD.

One area of particular interest regarding film deposition lies in emerging fuel cell technology where catalyst layers are provided to an ion exchange membrane in order to facilitate the electrochemical reaction needed to sustain electrical output. For efficient fuel cell operation, the catalyst layers must not only adequately contact the ion exchange membrane and adjacent anode or cathode electrodes, but also allow access to the gaseous reactants fed to each electrode, typically a hydrogen-rich gas and an oxygen-rich gas. The catalyst layers are typically deposited upon the ion exchange membranes through either a 'wet chemistry' process involving aqueous solutions at approximately atmospheric pressures, or by utilizing jet vapor technology, for example, sputtering or the like, operating at reduced pressures.

The wet chemistry process produces catalyst layer films of nanoclusters having the proper size and activity, but is not very efficient as many of the nanoclusters which contact the electrode material do not contact the ion exchange membrane while still other nanoclusters are lost deep in the pores of the membrane itself. Vapor deposition of catalyst layers is more efficient in depositing the nanoclusters at the electrode/membrane interface, however the activity of the resultant catalyst layer has yet to match the performance of the catalyst layers deposited as a result of the wet chemistry process. In essence, the wet chemistry process ensures appropriate catalysis, but is too inefficient while the vapor deposition improves efficiency, but suffers from poor catalytic activity. Moreover, the existing catalyst layer deposition processes are too uneconomical for large scale production.

The present invention therefore seeks to create a heretofore unknown hybrid process for the deposition of metallic nanoclusters, for use with technologies such as fuel cell applications, which is effective, economical and applicable to large scale production.

SUMMARY OF INVENTION

It is an object of the present invention to provide a method and apparatus for the deposition of metal nanoclusters and films on a substrate.

It is another object of the present invention to provide a method and apparatus for the deposition of metal nanoclusters and films on a substrate utilizing a hybrid JVD/wet chemistry process.

It is another object of the present invention to increase the efficiency of deposited film while reducing the cost to produce the same.

These and other objectives of the present invention, and their preferred embodiments, shall become clear by consideration of the specification, claims and drawings taken as a whole.

DESCRIPTION OF PREFERRED EMBODIMENTS

Figure 1:
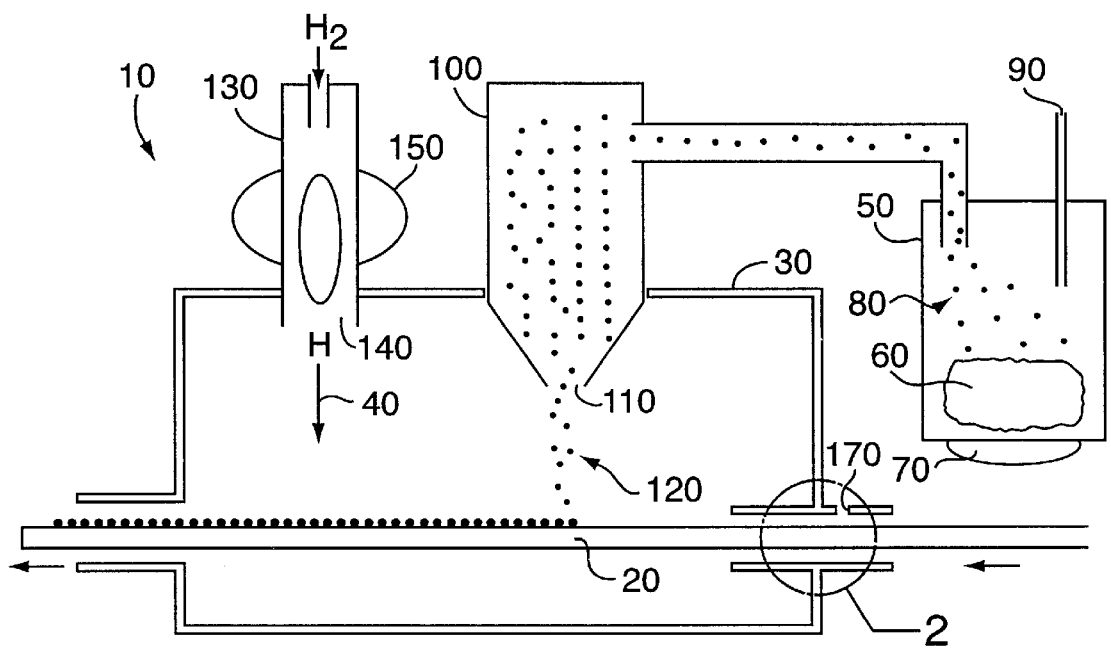
FIG. 1 illustrates a deposition apparatus for depositing a layer of metallic nanoclusters on a substrate, according to one embodiment of the present invention.

According to one embodiment of the present invention, an apparatus for depositing metallic nanoclusters on a substrate is depicted in FIG. 1 and is indicated generally by reference numeral 10. The deposition apparatus 10 includes a movable substrate 20 which is fed through a deposition chamber 30 by an unillustrated supply and take-up reel and motor assembly. As will be appreciated, the unillustrated supply and take-up reel and motor assembly may be operated at any prescribed velocity in dependence upon the particular materials and being deposited and the environmental conditions of the deposition chamber 30 itself.

As was briefly discussed previously, the present invention seeks to deposit metallic nanocluster layers upon substrates including proton exchange membranes (PEMs), carbon-based electrodes and other gas diffusion membranes by utilizing atomic hydrogen bombardment to reduce metallic inorganic and metallic organic precursor compounds to a layer of free metals. FIG. 1 depicts a two stage process by which metallic precursor compounds are applied to the substrate 20 and subsequently bombarded with an atomic hydrogen jet 40 within the deposition chamber 30.

An aerosol chamber 50 is employed to house a measured amount of an aqueous precursor solution 60 which is subsequently nebulized by an ultrasonic transducer 70, or the like, to form a precursor aerosol 80. The aerosol chamber 50 is additionally supplied with an inert carrier gas, usually Helium (He) or Argon (Ar), via an inlet 90, which entrains the precursor aerosol 80 and delivers the precursor aerosol 80 to a JVD nozzle 100. The JVD nozzle 100 is equipped with an opening 110 located within the deposition chamber 30 and propels the precursor aerosol 80 to the substrate 20 at sonic—or supersonic velocities. Operating pressures are usually in the range of 1 to 10 torr in the nozzle 100, and 0.1–1 torr down-stream in the deposition chamber 30; many JVD advantages can be traced to this choice of pressure regime. The carrier gas is driven by a mechanical pump (not shown) under "critical flow" conditions, ($P_{nozzle}/P_{downstream} \geq 2$), so that a collimated precursor jet 120 emerges approximately at the speed of sound, approximately $10^5$ cm/sec for He, to impact the substrate 20.

A microwave discharge jet 130 also has an opening 140 formed within the deposition chamber 30 and is utilized to direct the collimated hydrogen jet 40 to the substrate 20 upon which the metallic precursor layer has been deposited. A microwave heating cavity 150 surrounds the housing of the microwave discharge jet 130 external to the deposition chamber 30. The microwave heating cavity 150 is operated at an appropriate power, on the order of approximately 75 watts, to enable an incoming hydrogen stream ($H_2$) to be cracked thereby producing the collimated hydrogen jet 40 comprising atomic hydrogen (H).

While a microwave heating element operated at approximately 75 watts has been described, the present invention is not limited in this regard as other heating elements and corresponding energy operating levels may be alternatively substituted without departing from the broader aspects of the present invention. Also, while a hydrogen stream ($H_2$) has been described, the present invention is not limited in this regard as other elements having chemical qualities similar to that of hydrogen may alternatively be employed without departing from the broader aspects of the present invention. Indeed a major aspect of the present invention is the ability to utilize either a $H_2$ or $H_2O$ gaseous stream to supply the H atoms for metal reduction. It has been discovered that while the plasma chemistry of $H_2$ may be simpler, the use of water vapor provides the advantages of ease of procurement and storage, extremely low cost and safety. Moreover, the use of a water vapor plasma jet has been shown to reduce metal salts even more efficiently than a $H_2$ plasma jet, thereby further increasing the efficiency of the present invention.

Returning now to FIG. 1, as the substrate 20 travels through the deposition chamber 30 the collimated precursor jet 120 produces a substantially uniform layer of precursor nanoclusters on the substrate 20. By this operation, a thin precursor layer may be deposited at low loadings thereby advantageously increasing efficiency and reliability at a low cost. The layer of precursor nanoclusters is subsequently subjected to the collimated hydrogen jet 40 which reduces the deposited precursors to metallic nanoclusters prior to the substrate 20 exiting the deposition chamber 30.

The deposition apparatus 10 therefore provides many advantageous results not heretofore known and of particular import to the deposition of catalyst layers on a PEM or other gas diffusion membranes utilized in the fuel cell technology field. Utilizing the microwave discharge jet 130 ensures that the hydrogen jet 40 is striking the precursor layer at high velocities and at approximately room temperatures, thereby avoiding the high temperatures typically necessary to produce hydrogen reduction that would destroy sensitive gas diffusion membranes, such as NAFION™.

In addition, the rate at which a gas diffusion membrane, acting as the substrate 20, may be coated is markedly increased due to the velocity of the impacting hydrogen jet 40 and the integrated reel and motor assembly which continuously moves the substrate through the deposition chamber 30. Recent experiments suggest that a layer of metallic nanoclusters may be deposited upon a 1" strip of substrate at approximately 50–80 feet per minute while still maintaining acceptable levels of quality and conformity in the metallic nanocluster layer. It should be readily appreciated that the deposition apparatus 10, depicted in FIG. 1, is capable of providing a continuous application of a uniform layer of metallic nanoclusters in a controlled environment, resulting in a more efficient and reliable production of such metallic layers or films. Furthermore, as platinum (Pt) is commonly utilized as the catalyst layer in PEM fuel cell applications, the efficient deposition of this metal has obvious and significant cost benefits.

It is another important aspect of the present invention that the operating complexity of the deposition apparatus 10 need not be over-whelming as the microwave discharge jet 130 must only supply an excess of H for precursor reduction, which it can easily do, and otherwise its operation is not critical to the overall production of the nanocluster layer.

Referencing once again FIG. 1, it will be readily appreciated that the effectiveness of the JVD deposition apparatus 10 is due in great measure to the low vacuum environment within the deposition chamber 30. In order to maintain the deposition chamber 30 free from contamination by the ambient air existing at atmospheric pressure outside of the deposition chamber 30, an inert gaseous curtain is utilized to produce an air to vacuum seal for the deposition chamber 30.

Figure 2:
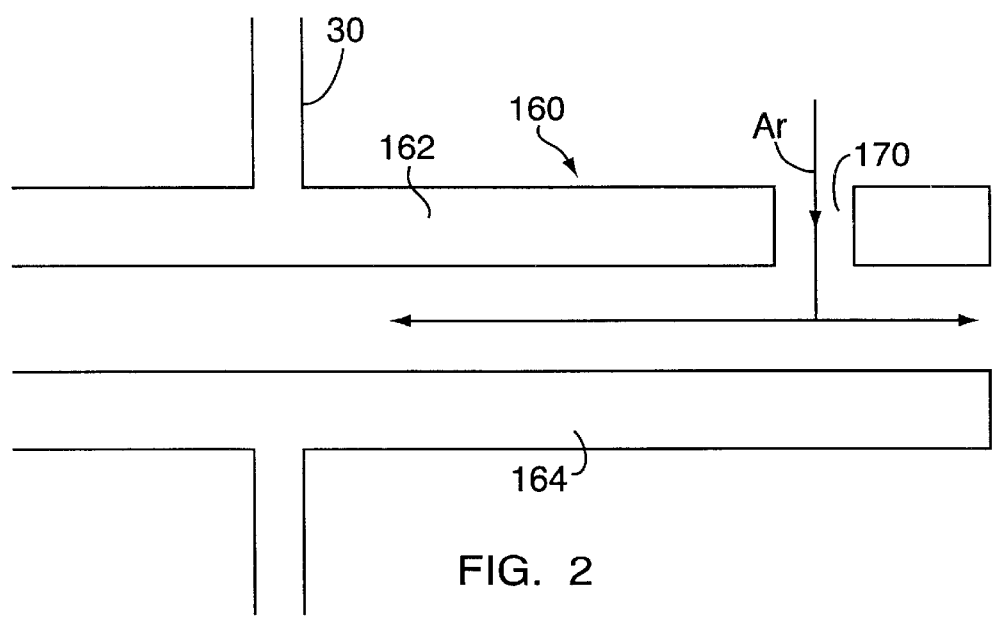
FIG. 2 is a cross-sectional view of an air-to-vacuum seal for use with a deposition chamber of the present invention.

As depicted in more detail in FIG. 2, the passageway into the deposition chamber 30 includes an inlet section 160 comprising two oblong aluminum blocks, 162 and 164, shown in cross-section. The blocks 162 and 164 are machined flat and sealed to one another with non-illustrated o-rings or the like, about their outer edges. A thin slot is machined into one of the blocks, 162 and 164, to create a passage for feeding the substrate 20 through to the deposition chamber 30. Ambient air at atmospheric pressure is prevented from leaking through the slot into the deposition chamber 30 by countering the potential air leak with an opposing, and slightly greater flow of pure Argon (Ar), or the like, to form an inert gaseous curtain. The pressurized Ar stream is injected through an aperture 170 formed in one of the blocks, 162 and 164, and produces a small flow of pure Ar out of the deposition chamber 30, rather than permitting ambient air from entering the deposition chamber 30. The magnitude of the required Ar stream is determined by the slot height, width and length.

The inert gaseous curtain provided through the aperture 170 therefore provides an efficient and effective barrier to air contamination without impeding the feeding of the substrate through the deposition chamber 30. Moreover, as there are no moving parts and no differential pumping stage is necessary given that the JVD deposition process does not require a high vacuum to exist anywhere, the air to vacuum seal is easy to operate and extremely reliable. It has been discovered that the slot height may be chosen to be comfortably larger than the thickness of the substrate without incurring a high leak rate, thereby allowing an economical flow of Ar, or other inert gas, stream to be utilized.

As discussed above in relation to FIGS. 1 and 2, the deposition apparatus 10 has been described as performing the deposition of a precursor layer inside the deposition chamber 30, under low vacuum conditions, thereby allowing aqueous precursor solutions to be nebulized in pressure environments of approximately 5 torr before the liquid water vapor will freeze. Alternative embodiments of this architecture, however, are equally effective and somewhat simpler in operation.

The present invention additionally contemplates deposition of a precursor layer upon a substrate outside of the deposition chamber. In one such alternative embodiment it is possible to obtain a precursor coated substrate from industrial sources, particularly in those fields dealing with catalyst deposition, where expertise in controlling the appropriate precursor nanocluster size is well established. Once obtained, the coated substrate may be fed through an air-to-vacuum seal and deposition chamber, similar to those illustrated in FIGS. 1 and 2, where H atom bombardment will act to reduce the precursor layer to metallic nanoclusters.

Another embodiment of the present invention utilizes well known 'wet chemistry' processes to spray a precursor layer onto a substrate outside of a JVD chamber. The substrate is then fed through an air-to-vacuum seal and deposition chamber, similar to those illustrated in FIGS. 1 and 2, where H atom bombardment will act to reduce the precursor layer to metallic nanoclusters. This heretofore unknown combination of a wet chemistry process with a low vacuum JVD apparatus produces many benefits, including simplicity, ease of control of precursor uniformity, absence of space restrictions and possibility of inspection for flaws in the precursor layer before the reduction step begins. Moreover, because accessibility is greater, it is easier to deposit complex precursors or lay down precursor patterns prior to the substrate being introduced to the deposition chamber.

Figure 3:
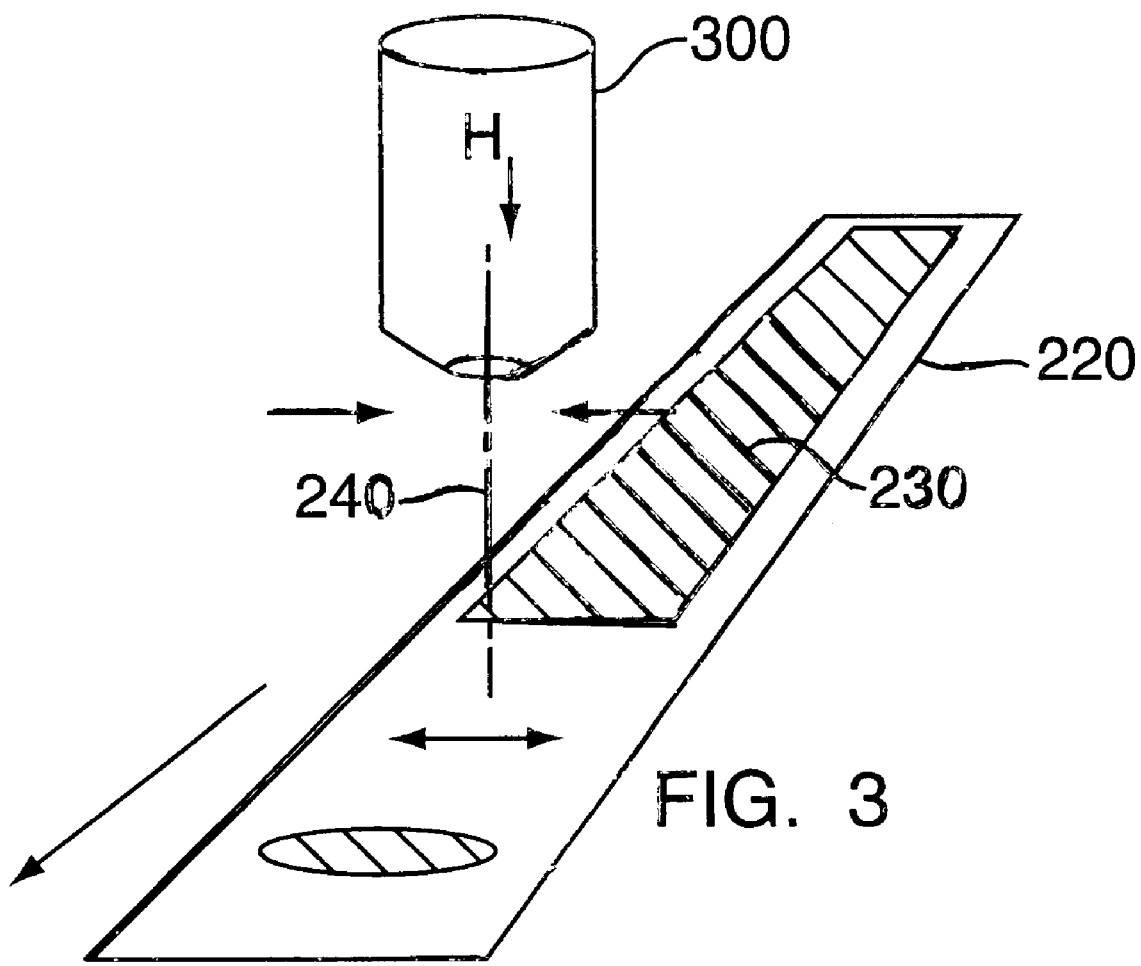
FIG. 3 illustrates rastering a hydrogen jet over a substrate to effectuate reduction of a precursor layer.

FIG. 3 illustrates a substrate 220 upon which a precursor layer 230 has been deposited outside of a JVD chamber. The coated substrate 220 is fed through an unillustrated JVD chamber where a JVD nozzle 300 produces a hydrogen jet 240 which impacts the precursor layer 230 to effectuate reduction of the precursor layer 230, as discussed previously. As depicted in FIG. 3, it is possible to raster the hydrogen jet 240 in a direction perpendicular to the motion of the substrate 220 to completely expose the precursor layer 230 to the reducing effects of the hydrogen jet 240. The hydrogen jet 240 may be rastered in any manner, such as by physically moving the JVD nozzle 300 or by gas-dynamically deflecting the hydrogen jet 240, without departing from the broader aspects of the present invention. In this manner, reduction of precursor nanoclusters may be accomplished over a wide area with great reliability and efficiency.

While rastering the hydrogen jet is possible, other alternative methods of providing hydrogen atoms over a wide area are also envisioned. It is alternatively possible to utilize a JVD slot shaped nozzle having a rectangular waveguide/cavity the width of the substrate for reducing the precursor layer. This configuration has the advantages of having no moving parts and no need to raster the hydrogen jet, thus reducing complexity. Another method contemplated by the present invention concerns creating a high voltage glow discharge, in the range of approximately 500 volts, having a slotted discharge aperture the width of the substrate. By passing a $H_2$ stream through such a potential, this configuration also supplies H atoms in the proper concentration to promote the reduction of the precursor layer.

A JVD electron jet can also supply extremely high levels of H atoms for high speed applications and entails a slot shaped JVD nozzle and a long, hot filament to act as a line source of thermionic electrons for generating dense plasma.

While the foregoing applications have all utilized moving a substrate in a linear fashion to be exposed to one or more jet sources, it is also possible to utilize a batch approach to producing metallic films and coatings. In a batch approach, multiple jet sources are directed towards a substrate mounted on a spinning carousel. In one embodiment, a precursor layer may be loaded upon a substrate which is then exposed to a hydrogen jet as the carousel rotates. Another embodiment entails spinning a carousel-supported substrate which may be exposed periodically and repetitiously to a nebulized precursor jet which first lays down a precursor layer, to be followed by a hydrogen jet which reduces the precursor layer to metallic nanoclusters.

The present invention has been described in conjunction with producing metallic films on gas diffusion membranes for use with fuel cell applications, however the present invention is not limited in this regard. Not only are nanocrystalites of metallic salt precursors, such as chloroplatinic acid, $H_2Pt(Cl)_6$, capable of being reduced by the bombardment of H atom jets, but other metal organic and inorganic precursors may also be utilized. Similarly, it is the intention of the present invention to propose use of the disclosed apparatuses and methods to other metals, substrates and very thin film deposition applications.

It is also important to note that in the present invention the final deposited species do not originate inside of the JVD nozzle, as is the case with other JVD applications, but rather form on the substrate surface.

While the present invention has been described with reference to the preferred embodiment, it will be understood by those skilled in the art that various obvious changes may be made, and equivalents may be substituted for elements thereof, without departing from the essential scope of the present invention. Therefore, it is intended that the invention not be limited to the particular embodiments disclosed, but that the invention includes all embodiments falling within the scope of the appended claims.

What is claimed is:

1. A method for forming metallic nanoclusters upon a substrate, said method comprising the steps of:

moving said substrate through a deposition chamber at a predetermined uniform velocity;

depositing metallic precursor compounds onto said substrate; and bombarding said metallic precursor compounds with a jet of atomic hydrogen subsequent to said deposition of said metallic precursor compounds on said substrate, thereby forming said metallic nanoclusters.

2. The method for forming metallic nanoclusters upon a substrate according to claim 1, further comprising the steps of:

maintaining said deposition chamber at a lower than ambient pressure.

3. The method for forming metallic nanoclusters upon a substrate according to claim 1, further comprising the steps of:

feeding said substrate into said deposition chamber through an opening in said deposition chamber; and providing a pressurized gaseous stream adjacent to said opening, said pressurized gaseous stream forming thereby a gaseous barrier against an introduction of ambient atmosphere into said deposition chamber.

4. The method for forming metallic nanoclusters upon a substrate according to claim 3, further comprising the steps of:

maintaining said pressurized gaseous stream at a higher than ambient pressure.

5. The method for forming metallic nanoclusters upon a substrate according to claim 3, wherein:

said pressurized gaseous stream is comprised of an inert gas.

6. The method for forming metallic nanoclusters upon a substrate according to claim 1, further comprising the steps of:

depositing said metallic precursor compounds onto said substrate outside of said deposition chamber.

7. The method for forming metallic nanoclusters upon a substrate according to claim 1, further comprising the steps of:

depositing said metallic precursor compounds onto said substrate within said deposition chamber.

8. The method for forming metallic nanoclusters upon a substrate according to claim 1, further comprising the steps of:

rastering said jet so as to direct said jet over substantially the entirety of said substrate supporting said deposited metallic precursor compounds.

9. The method for forming metallic nanoclusters upon a substrate according to claim 1, further comprising the steps of:

utilizing one of a $H_2$ stream and a $H_2O$ stream as a source stream for said jet of atomic hydrogen.

10. The method for forming metallic nanoclusters upon a substrate according to claim 9, further comprising the steps of:

heating said source stream until said source stream cracks, thereby producing said atomic hydrogen.

11. A method for forming metallic nanoclusters upon a substrate, said method comprising the steps of:

moving said substrate through a deposition chamber;

depositing metallic precursor compounds onto said substrate; and bombarding said metallic precursor compounds with a jet of hydrogen containing molecules, said jet of hydrogen containing molecules being partially comprised of atomic hydrogen, subsequent to said deposition of said metallic precursor compounds on said substrate, thereby forming said metallic nanoclusters.

* * * * *